United States Patent Office 3,341,328

Patented Sept. 12, 1967

3,341,328

PHOTOPOLYMERIZATION SYSTEM USING CERIC SALTS

Andre K. Schwerin, deceased, late of Binghamton, N.Y., by Johanna Schwerin, administratrix, Binghamton, N.Y., and Edward Cerwonka, Binghamton, N.Y., assignors to General Aniline & Film Corporation, New York, N.Y., a corporation of Delaware No Drawing. Filed Dec. 21, 1964, Ser. No. 420,210
10 Claims. (Cl. 96—35.1)

ABSTRACT OF THE DISCLOSURE

Light-sensitive element having a photopolymerizable coating comprising a hydrophilic colloid carrier, a water-soluble ceric salt, an alkali metal or ammonium salt of oxalic acid or of an aliphatic alphahydroxycarboxy acid, and an ethylenically unsaturated monomer; a method of preparing the same, and a process of producing an image thereon by imagewise exposure to radiation and washing with water to remove unexposed portions of the coating.

This application is a continuation-in-part of U.S. application Ser. No. 229,502 filed Oct. 9, 1962, and now abandoned.

The present invention relates to the imagewise photopolymerization of ethylenically unsaturated organic compounds while employing as the photoinitiator for such polymerizations, a light-sensitive ceric salt in the presence of an alkali metal salt of oxalic acid or of an α-hydroxy acid. More particularly, the invention relates to photopolymerizable compositions and to photographic elements carrying such compositions.

It is well known in the art that the polymerization of various ethylenically unsaturated organic compounds, commonly referred to as vinyl monomers, may be effected by the process of addition polymerization. Moreover, it is understood that this process of addition polymerization can be initiated by actinic radiation and, that the rate of such photopolymerization is increased by certain compounds which are photoinitiators. The types of chemical compounds known to be photoinitiators are restricted and only very few are of sufficient activity to render imagewise photopolymerization a practical photographic process. Consequently, new types of photoinitiators or photopolymerization catalysts of high activity are considered to be most desired by the art.

The photoreduction of certain ceric salts to the cerous valence state is known and has been described in the literature. It is also known that the oxidation-reduction process that occurs when certain ceric salts, such as ceric ammonium nitrate are contacted with a variety of reducing agents such as oxalic acid can no longer be considered a photoreduction, but results in the intermediate formation of free radical species capable of initiating addition polymerization of ethylenically unsaturated monomers. Thus, the oxidation of oxalic acid by ceric ion produces an intermediate carbon dioxide radical-ion.

$$Ce^{+4}+H_2C_2O_4 \longrightarrow Ce^{+3}+2H^{+1}+CO_2+.CO_2^{-1}$$

When a reducing agent, such as oxalic acid is added to a solution containing a ceric salt, such as ceric ammonium nitrate, and a vinyl monomer, such as acrylamide, spontaneous polymerization will ensue. This type of polymerization initiated by the radical fragments resulting from the oxidation-reduction reaction is an example of free radical, addition polymerization and is commonly referred to as redox initiated polymerization. This reaction proceeds already in the dark and cannot be utilized for photographic purposes.

It has now been discovered that the combination of a light-sensitive ceric salt and the ammonium or the alkali metal salt of oxalic acid or of an organic aliphatic α-hydroxy-substituted carboxylic acid will not cause spontaneous polymerization, provided the concentration of the ceric salt is maintained below a certain critical value and the alkali metal salt concentration is maintained above certain critical values. When using these concentrations, polymerization of ethylenically unsaturated monomers will be induced when such monomers are exposed to actinic radiation. No reaction occurs in the dark so long as the necessary excess of alkali metal salt is maintained. The exact mechanism of the reaction is not fully understood. However, it is believed that polymerization of the vinyl monomer is caused by free radicals produced by photodecomposition of an intermediate complex formed between the light-sensitive ceric salt and the alkali metal salt.

The process of this invention can be carried out by any of the conventional photopolymerization techniques involving irradiation with light. Such methods include the bulk, emulsion, suspension and solution polymerization methods. The process of this invention is most effective when the polymerization system is exposed to ultraviolet or visible light. Sources of light that are particularly useful include sunlight, mercury arcs, fluorescent light bulbs with special phosphors having maximum emission in the ultraviolet and sun lamps of all types.

In its preferred form, the invention provides new compositions suitable for use in preparing photographic polymeric images. The invention further includes processes involving the use of these compositions to form such images.

The photosensitive complex is prepared by adding an aqueous solution of a cerium salt, e.g., ceric sulfate, ceric ammonium sulfate, ceric nitrate or ceric ammonium nitrate to the aqueous solution of a molar excess of an ammonium or alkali metal salt of oxalic acid or an α-hydroxy-substituted aliphatic carboxylic acid including citric acid, glycollic acid, lactic acid, α-hydroxybutyric acid, α-hydroxyisobutyric acid, α-hydroxyvaleric acid, α-hydroxy-caproic acid, α-hydroxy-enanthic acid, α-hydroxy-caprylic acid, tartronic acid (hydroxymalonic acid), tartaric acid or malic acid (hydroxysuccinic acid).

Care must be taken that the molar ratio of the above ammonium or alkali metal salt to that of the cerium salt exceeds at least 3.0 to 1.0. However, a molar excess as high as 25:1 has been found useful. When this concentration ratio is maintained, a clear orange colored solution of the light-sensitive ceric salt complex is formed. The pH of this solution may range from 3.5 to 7.0. The molar excess of the ammonium or alkali metal salts of organic α-hydroxy-substituted carboxylic acid must be maintained in order to prevent the polymerization of the monomer in the dark. These compositions are dissolved in a suitable solvent, preferably water, and used in combination with a monomer containing the grouping $CH_2{=}CH{-}$, such as acrylamide, N,N'-methylenebisacrylamide and mixtures thereof. A hydrophilic colloidal carrier material such as polyvinylpyrrolidone or polyacrylamide is used in combination with the above mixture. Other carrier materials, as exemplified by gelatin or hydroxyethyl cellulose can be used so long as it is made sure that the last traces of oxidizing agents are removed by suitable treatments.

The light sensitive layer was prepared by coating this solution onto a suitable carrier. When the respective concentrations of the two redox components (ceric salt and alkali metal salt) are maintained at the proper value which is unsuitable for spontaneous polymerization, a stable photopolymerizable coating can be prepared. When such a coating is exposed imagewise to actinic light, rapid polymerization ensues in the exposed areas. This photopolymerization occurs in an imagewise manner, as evidenced by the finding that exposure of such a coating through a photographic line negative produces, after washout of the unexposed and therefore unpolymerized parts with a suitable solvent such as water, a positive resist image corresponding to the transparent parts of the negative pattern. The resist image may be either pre- or post-dyed according to well-known methods and may serve, when coated on a transparent film base, as an imagewise colored foil in the audio-visual or color proofing field. In another variation, the hydrophilic binder may be replaced by an emulsion of a lipophilic resin such as the emulsion of the terpolymer of vinyl acetate, butyl maleate and acrylic acid, or of the terpolymer of vinyl acetate, octyl fumarate and maleic acid. Terpolymers of this type are commercially available, for instance, under the trade name Resyn 1234 as sold by the National Starch and Chemical Corporation. Such a coating prepared on a suitable support will produce, after exposure and washout, a strongly lipophilic resist which may serve as a planographic resist of high greasy ink acceptance for use in the offset printing field.

The ceric salts which may be used in accordance with the invention comprise all water-soluble ceric salts of mineral acids which can be dissolved in the polymerizable system. As typically suitable ceric salts, there may be mentioned the following: ceric ammonium nitrate, ceric ammonium sulfate, ceric sulfate, ceric nitrate, ceric potassium nitrate, ceric nitrate, ceric perchlorate, and ceric iodate.

The amount of ceric salt utilized can be varied over a wide range provided the concentration is maintained below the level necessary to initiate spontaneous polymerization in the absence of light. This concentration must, of course, be determined for each specific combination of ceric salt and reducing agent. However, generally speaking, from 1–8% of the ceric salt based on the weight of monomer, gives the desired results.

The ammonium and alkali metal salts of oxalic acid and the α-hydroxy acids that may be used in accordance with the invention together with a ceric salt of a mineral acid form a stable system in the dark which will not initiate vinyl polymerization except upon irradiation with actinic light. These organic salts are used in amounts which range from 3 to 100% based on the amount of monomer, but must exceed the amount of a water soluble ceric salt of mineral acid by a molar ratio higher than 3. The amount of colloidal carrier material is at least equal to the amount of monomer, but may exceed the amount of monomer by a factor ranging as high as 15.

The starting vinyl compounds may comprise any of the known polymerizable, ethylenically unsaturated, organic compounds containing the grouping $CH_2{=}CH{-}$. Examples of preferred monomers include acrylamide, methacrylamide, methacrylic acid, acrylic acid, acrylonitrile, vinylpyrrolidone, vinyl acetate, methyl acrylate, styrene, etc. In addition, divinyl and polyvinyl polymerizable organic compounds, widely known in the art as cross-linking agents, are useful in the invention to increase the water insolubility of the resist image formed in the photographic aspects of the invention. Examples of such cross-linking, polyvinyl compounds are: N,N′-methylenebisacrylamide, N,N′-carboxymethylenebisacrylamide, calcium acrylate, divinylbenzene, N,N-di-allylmelamine, and tri-allyl cyanurate. It is to be understood, however, that the above cross-linking agents may be used as the sole monomers.

While practicing the photographic aspects of the invention, it is desirable to employ a hydrophilic colloid as the carrier for the initiation system and monomer. Suitable colloidal carriers for this purpose include polyvinyl alcohol, gelatin, casein, glue, zein, carboxymethyl cellulose, polyvinylpyrrolidone, polyacrylamide, and the like.

It has been found that small amounts or even traces of per compounds interfere with the reaction. Frequently the colloidal carrier materials contain such per compounds. In preparing a photopolymerizable composition on a support, those binders or carriers which contain per compounds (such as peroxide or persulfate) must be treated in such a manner that any per compound present, even in trace quantity, is destroyed. Many carriers are found to be contaminated with per compounds as a result of the manner in which they have been manufactured or processed. So-called inert gelatin, for example, contains trace amounts of peracetic acid. Low-viscosity hydroxyethyl cellulose contains a per compound which has been introduced to break down the high-viscosity hydroxyethyl cellulose to the low-viscosity grade. Some batches of polyvinylpyrrolidone contain persulfate used in the manufacture of that polymer. Such trace quantities of per compounds can be destroyed in several ways, thus rendering the binder or carrier suitable for photopolymerizable compositions which are stable in the dark. One method of per compound removal consists in appropriately arranging the order of addition of the ingredients which make up the composition. For example, gelatin may be heated in solution with ceric ammonium nitrate for several minutes before adding the ceric-gelatin suspension to the alkali metal salt of the organic acid being used and before introducing the monomer ceric salts of mineral acids are known to react with hydroperoxides as follows:

$$2Ce^{+4}+ROOH \longrightarrow 2Ce^{+3}+O_2+R^{+}+H^{+}$$

In this formula, R is an organic radical such as cumyl or paramenthyl, which tends to become part of a stable hydroperoxide. ROOH may also represent hydrogen peroxide (HOOH). The presence of cerous ion in the composition does not affect stability. It should be noted, however, that large concentrations of per compound will reduce the light sensitivity of the coating by converting more and more ceric ion to the non-photosensitive cerous ion.

The base on which such coatings may be applied may be paper, film, e.g., cellulose esters; polystyrene, polycarbonate, polyester, or any of the metallic supports commonly used in the photomechanical arts such as zinc or copper sheets and aluminum sheets which have been suitably treated, for instance, by anodization or mechanical treatment to provide the proper adhesion.

The following examples illustrate various modifications and aspects of the invention, although it is to be understood that various modifications will be apparent to persons skilled in the art so that the invention is not intended to be restricted by these examples.

*Example I*

| | | |
|---|---|---|
| Ceric ammonium nitrate | g | 0.5 |
| Potassium oxalate monohydrate (25 g./100 ml., aq.) | ml | 5.0 |
| N,N′-methylenebisacrylamide (recrystallized twice from water) | g | 2.0 |
| Polyvinylpyrrolidone (Antara K–30) | g | 15.0 |
| Water to make | ml | 50.0 |

The ingredients were mixed in white light, with the exception of the ceric ammonium nitrate, which was added in red light. The solution was coated on baryta paper and allowed to dry. Exposure was made of a sample through a negative to the light from a 375-watt reflector lamp at a distance of sixteen inches for a period of thirty seconds. Washout with warm water gave a resist.

Exposure of a sample of the coating after four weeks' storage at room temperature gave a similar result. There was no evidence of polymerization taking place during storage.

*Example II*

| | | |
|---|---|---|
| Ceric ammonium nitrate | g | 0.5 |
| α-Hydroxyisobutyric acid | g | 1.4 |
| Ammonium hydroxide, 6 N | ml | 2.2 |

*Example II*—Continued

| | | |
|---|---|---|
| N,N′-methylenebisacrylamide (recrystallized twice from water) | g | 2.0 |
| Polyvinylpyrrolidone (Antara K-30) | g | 15.0 |
| Water to make | ml | 50.0 |

The ingredients were mixed in white light, with the exception of the ceric ammonium nitrate, which was added in red light. The solution was coated on baryta paper and allowed to dry. A test of a sample of this coating was carried out in the same manner as the sample in Example I. A resist was again obtained after washout.

*Example III*

| | | |
|---|---|---|
| Ceric ammonium nitrate | g | 0.5 |
| Sodium citrate monohydrate | g | 1.0 |
| N,N′-methylenebisacrylamide (recrystallized from water) | g | 2.0 |
| Polyvinylpyrrolidone (Antara K-30) | g | 15.0 |
| Water to make | ml | 50.0 |

The ingredients of the formulation were mixed in white light, with the exception of the ceric ammonium nitrate, which was added in red light. The solution was coated on baryta paper and allowed to dry. A test sample of this coating was treated in the same manner as the sample in Example I. Again, a resist was observed after washout.

*Example IV*

| | | |
|---|---|---|
| Gelatin | g | 5.0 |
| Ceric ammonium nitrate | g | 0.5 |
| Potassium oxalate monohydrate (25 g./100 ml., aq.) | ml | 5.0 |
| N,N′-methylenebisacrylamide (recrystallized twice from water) | g | 2.0 |
| Water to make | ml | 50.0 |

The ceric salt was dissolved in a portion of the water and was then added to a suspension of the gelatin in about 25 ml. water. A tanning or hardening of the gelatin took place. The suspension was heated with stirring on the steam bath for five minutes. At the end of this period, the taffy-like mass was added (in red light), with stirring, to the potassium oxalate solution. The hardened gelatin gradually dissolved in the oxalate. Monomer in hot water was then stirred into the ceric-gelatin-oxalate mixture. The solution was then ready for coating. It was coated on the "non-curl" side of film base and allowed to dry (in red light). Exposure was made of a sample through a negative to the light from a 375-watt reflector lamp at a distance of sixteen inches for a period of thirty seconds. Washing with warm water removed the unexposed portions and gave a resist which was an image of the exposed areas.

*Example V*

Sodium citrate monohydrate, 1.0 g. was substituted for the potassium oxalate of Example IV. The procedure of mixing, coating and testing was the same as that described in Example IV. An exposure of sixty seconds produced a resist image after washout.

*Example VI*

Hydroxyethyl cellulose (commercially available as Hercules Natrosol 250L), 2.5 g. was substituted for the gelatin of Example IV. The procedure of mixing, coating, and testing was the same as that described in Example IV. An exposure of sixty seconds yielded a resist image after washout.

The photographic speed obtained with the above formulations is high enough to obtain direct photographic copies as well as enlargements. It will be realized that film coatings are preferably exposed from the backside through the transparent support in order to provide increased adhesion of the polymerization product to the base. Further increase of photographic speed may be accomplished by raising the concentration of the ceric salt or of the reducing agent or even the combination of both redox components beyond the concentrations shown by the examples. It will be understood, however, that these concentrations must be kept well below those limits at which spontaneous polymerization occurs in the dark and without exposure to light.

We claim:

1. A light-sensitive element carrying on a suitable support, a photopolymerizable coating comprising a hydrophilic colloidal carrier material, a water-soluble ceric salt, a salt selected from the group consisting of ammonium and alkali metal salts of oxalic acid and aliphatic α-hydroxy-substituted carboxylic acids and an ethylenically unsaturated monomer, the ratio of said salt being at least three molar equivalents based on the amount of ceric salt.

2. The element as defined in claim 1, wherein the ceric salt is ceric ammonium nitrate.

3. The element as defined in claim 1, wherein the salt is potassium oxalate.

4. The element as defined in claim 1, wherein the ceric salt is ceric ammonium nitrate and the salt is sodium citrate.

5. The element as defined in claim 1, wherein the salt is the ammonium salt of α-hydroxyisobutyric acid.

6. A process of producing a photopolymer resist which comprises exposing under a pattern, the coating of claim 1 with electromagnetic radiation ranging from the ultraviolet through the visible region of the spectrum, and washing the exposed coating with water to remove the unexposed residual portions of the coating.

7. A method of preparing a light-sensitive element which comprises heating an aqueous solution of an organic hydrophilic colloid carrier material and a water-soluble ceric salt to destroy traces of per compounds, mixing the resulting solution with an aqueous solution of a salt selected from the group consisting of alkali metal and ammonium salts of oxalic acid and of aliphatic alpha-hydroxy-substituted carboxylic acids, adding an ethylenically unsaturated monomer, the mol ratio of the latter salt to the ceric salt being at least 3:1, coating the resulting solution on a suitable support and drying.

8. A method as defined in claim 7 wherein the ceric salt is ceric ammonium nitrate and the carboxylic acid salt is sodium citrate.

9. A method as defined in claim 7 wherein the carboxylic acid salt is potassium oxalate.

10. A method as defined in claim 7 wherein the carboxylic acid salt is the ammonium salt of alpha-hydroxyisobutyric acid.

References Cited

UNITED STATES PATENTS 3,118,767 1/1964 Evans ---------- 96—115

OTHER REFERENCES

Levinos: AD-264,087, "Investigation of Photopolymerization Process," quarterly report No. 5, pp. 1–5, Mar. 15, 1962, to June 14, 1962, rec'd. Astia Nov. 11, 1961.

Levinos: AD-267-415, "Investigation of the Photopolymerization Process," final report, June 15, 1961, to Aug. 31, 1961, pp. 1–4, 15, 16, 25, rec'd. Astia Dec. 11, 1961.

Cerwonka: AD-274,200, "Investigation of Photopolymerization Process," first quarterly report, Nov. 15, 1961, to Feb. 14, 1962, p. 12, rec'd. Astia Apr. 17, 1962.

Cerwonka: AD-277,673, "Investigation of Photopolymerization Process," second quarterly report, Feb. 15, 1962, to May 14, 1962, pp. 1, 8–10, rec'd. Astia July 13, 1962.

NORMAN G. TORCHIN, *Primary Examiner.*

R. H. SMITH, *Assistant Examiner.*

Disclaimer

3,341,328.—*Andre K. Schwerin,* deceased, late of Binghamton, N.Y., by *Johanna Schwerin,* administratrix, Binghamton, N.Y., and *Edward Cerwonka,* Binghamton, N.Y. PHOTOPOLYMERIZATION SYSTEM USING CERIC SALTS. Patent dated Sept. 12, 1967. Disclaimer filed Sept. 30, 1982, by the assignee, *Eastman Kodak Co.*

Hereby enters this disclaimer to all claims of said patent.

[*Official Gazette March 8, 1983.*]